United States Patent
Kitagawa et al.

(10) Patent No.: US 11,171,022 B2
(45) Date of Patent: Nov. 9, 2021

(54) SUBSTRATE TREATMENT APPARATUS AND METHOD OF MANUFACTURING SEMICONDUCTOR DEVICE

(71) Applicant: TOSHIBA MEMORY CORPORATION, Minato-ku (JP)

(72) Inventors: Hakuba Kitagawa, Yokkaichi (JP); Yasuhito Yoshimizu, Yokkaichi (JP); Fuyuma Ito, Yokkaichi (JP); Hiroyuki Tanizaki, Yokkaichi (JP)

(73) Assignee: TOSHIBA MEMORY CORPORATION, Minato-ku (JP)

( * ) Notice: Subject to any disclaimer, the term of this patent is extended or adjusted under 35 U.S.C. 154(b) by 0 days.

(21) Appl. No.: 16/278,757

(22) Filed: Feb. 19, 2019

(65) Prior Publication Data

US 2020/0066550 A1 Feb. 27, 2020

(30) Foreign Application Priority Data

Aug. 27, 2018 (JP) .............................. JP2018-158556

(51) Int. Cl.
*H01L 21/67* (2006.01)
*H01L 21/3213* (2006.01)

(52) U.S. Cl.
CPC .... *H01L 21/6708* (2013.01); *H01L 21/32134* (2013.01)

(58) Field of Classification Search
None
See application file for complete search history.

(56) References Cited

U.S. PATENT DOCUMENTS

| | | | | |
|---|---|---|---|---|
| 5,032,217 A * | 7/1991 | Tanaka | ..................... | G03F 7/162 216/91 |
| 5,244,527 A | 9/1993 | Aoyagi | | |
| 5,853,483 A * | 12/1998 | Morita | ..................... | B05C 11/08 118/712 |
| 6,258,205 B1 * | 7/2001 | Chisholm | ............... | B24B 37/04 156/345.16 |
| 6,749,716 B2 * | 6/2004 | Ottow | ............... | H01L 21/31111 134/113 |
| 6,780,277 B2 * | 8/2004 | Yokomizo | ......... | H01L 21/31111 156/345.11 |
| 7,591,922 B2 * | 9/2009 | Okamoto | .......... | H01L 21/67253 134/113 |
| 7,935,217 B2 * | 5/2011 | Yashiki | ............. | H01L 21/67259 156/345.17 |

(Continued)

FOREIGN PATENT DOCUMENTS

| | | |
|---|---|---|
| JP | 64-053550 | 3/1989 |
| JP | 2-051 229 | 2/1990 |

(Continued)

*Primary Examiner* — Sylvia MacArthur
(74) *Attorney, Agent, or Firm* — Oblon, McClelland, Maier & Neustadt, L.L.P.

(57) ABSTRACT

In one embodiment, a substrate treatment apparatus includes a supporter configured to support and rotate a substrate, and a liquid supplier configured to supply a liquid to the substrate. The apparatus further includes a wall provided separately from the supporter and at least partially surrounding the supporter, and a detector provided between the supporter and the wall and configured to detect a change in the liquid.

17 Claims, 5 Drawing Sheets

(56) References Cited

U.S. PATENT DOCUMENTS

| | | | | |
|---|---|---|---|---|
| 8,043,469 | B2 * | 10/2011 | Nakamori | H01L 21/02019 |
| | | | | 156/345.21 |
| 8,262,845 | B2 * | 9/2012 | Doni | H01L 21/31111 |
| | | | | 156/345.15 |
| 8,815,048 | B2 * | 8/2014 | Miyagi | H01L 21/461 |
| | | | | 156/345.55 |
| 2002/0014403 | A1 | 2/2002 | Hoshino | |
| 2004/0261701 | A1 * | 12/2004 | Kobayashi | B05C 5/0216 |
| | | | | 118/696 |
| 2014/0261172 | A1 * | 9/2014 | Ito | H01L 21/67178 |
| | | | | 118/712 |
| 2015/0093906 | A1 * | 4/2015 | Kobayashi | H01L 21/31111 |
| | | | | 438/748 |
| 2020/0066550 | A1 * | 2/2020 | Kitagawa | H01L 21/6708 |

FOREIGN PATENT DOCUMENTS

| | | |
|---|---|---|
| JP | 8-260165 | 10/1996 |
| JP | 10-209112 | 8/1998 |
| JP | 2821286 | 11/1998 |
| JP | 2002-151462 | 5/2002 |

* cited by examiner

SUBSTRATE TREATMENT APPARATUS AND METHOD OF MANUFACTURING SEMICONDUCTOR DEVICE

CROSS REFERENCE TO RELATED APPLICATION

This application is based upon and claims the benefit of priority from the prior Japanese Patent Application No. 2018-158556, filed on Aug. 27, 2018, the entire contents of which are incorporated herein by reference.

FIELD

Embodiments described herein relate to a substrate treatment apparatus and a method of manufacturing a semiconductor device.

BACKGROUND

There is proposed a method of detecting an end point of wet etching or the like by an optical technique or a chemical technique for ending the wet etching or the like at an appropriate timing.

DETAILED DESCRIPTION

In one embodiment, a substrate treatment apparatus includes a supporter configured to support and rotate a substrate, and a liquid supplier configured to supply a liquid to the substrate. The apparatus further includes a wall provided separately from the supporter and at least partially surrounding the supporter, and a detector provided between the supporter and the wall and configured to detect a change in the liquid.

Embodiments will now be explained with reference to the accompanying drawings. In FIGS. 1 to 6, the identical or similar configuration is denoted by the same reference numeral, and an overlapping explanation thereof is omitted.

First Embodiment

Figure 1:
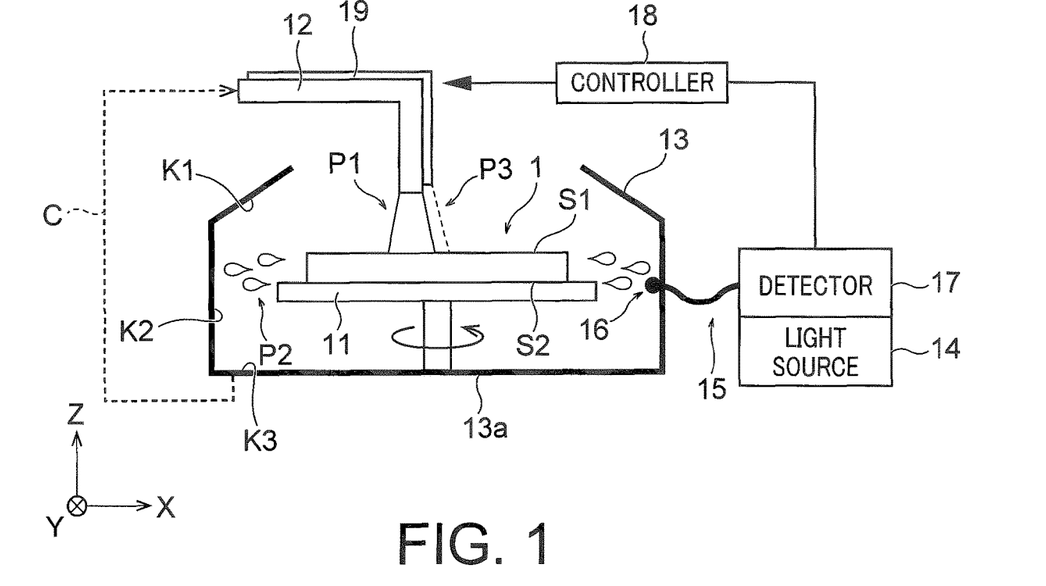
FIG. 1 is a cross-sectional view schematically showing a configuration of a substrate treatment apparatus of a first embodiment.

FIG. 1 is a cross-sectional view schematically showing the configuration of a substrate treatment apparatus of a first embodiment. The substrate treatment apparatus in FIG. 1 is a wet etching apparatus for etching a wafer 1 by using an etching liquid.

The substrate treatment apparatus in FIG. 1 includes a stage 11 which is an example of a supporter, an etching liquid nozzle 12 which is an example of an etching liquid supplier, a wafer container 13 having a storage portion 13a, a light source 14, an optical fiber 15, a probe 16, a detector 17, a controller 18, and a rinsing liquid nozzle 19 which is an example of a rinsing liquid supplier.

The stage 11 supports and rotates the wafer 1 in the wafer container 13. FIG. 1 shows an X direction and a Y direction which are parallel to an upper surface S1 and a lower surface S2 of the wafer 1 and are perpendicular to each other, and shows a Z direction which is perpendicular to the upper surface S1 and the lower surface S2 of the wafer 1. Herein, the +Z direction is regarded as the upward direction, and the −Z direction is regarded as the downward direction. The −Z direction may match the gravity direction, or may not match the gravity direction. The stage 11 of the present embodiment chucks the lower surface S2 of the wafer 1, but alternatively, may chuck a bevel of the wafer 1.

The etching liquid nozzle 12 ejects an etching liquid to the wafer 1 on the stage 11, as indicated by reference character P1, and the wafer 1 is etched with the etching liquid. The wafer 1 of the present embodiment includes a semiconductor wafer (substrate) such as a silicon (Si) wafer, and a workpiece film on the semiconductor wafer. The workpiece film is etched with the etching liquid. The etching liquid may be used for etching of the semiconductor wafer.

The etching liquid of the present embodiment is supplied to the upper surface S1 of the wafer 1 being rotated by the stage 11. Therefore, the etching liquid supplied to the wafer 1 is discharged from the wafer 1 while being scattered from the wafer 1 by a centrifugal force, as indicated by reference character P2. Reference character P1 indicates the etching liquid before etching of the wafer 1, whereas reference character P2 indicates the etching liquid after etching of the wafer 1.

The wafer container 13 is a container which contains the wafer 1 to be etched. Inner wall surfaces of the wafer container 13 include an inclined surface K1 disposed on an obliquely upper side of the wafer 1, a side surface (side wall portion) K2 disposed on a lateral side of the wafer 1, and a bottom surface K3 disposed below the wafer 1. The bottom surface K3 and a portion of the side surface K2 near the bottom surface K3 constitute the storage portion 13a into which the etching liquid is discharged from the wafer 1 after having performed treatment on the wafer 1. The substrate treatment apparatus of the present embodiment may include a flow passage C through which the etching liquid stored in the storage portion 13a is supplied again to the etching liquid nozzle 12. Accordingly, the etching liquid can be reused. The side surface K2 may surround the entirety of the stage 11, or may surround a portion of the stage 11.

In the wafer container 13, the wall constituting the side surface K2 functions as a guard for receiving the etching liquid scattered from the wafer 1. The etching liquid scattered from the wafer 1 collides with the side surface K2 of this wall, and falls down, like the stream of a waterfall, along the side surface K2 toward the storage portion 13a. The detector 17 of the present embodiment detects an end point of etching by using the etching liquid falling down along the side surface K2 toward the storage portion 13a, as described later. The side surface K2 of the wafer container 13 of the present embodiment is also called a splash guard.

The storage portion 13a of the present embodiment is provided inside the wafer container 13, but alternatively, may be provided outside the wafer container 13. An example of the storage portion 13a in this case is a waste-liquid collection tank provided outside the wafer container 13.

The light source 14 generates light to be applied to the etching liquid. The light from the light source 14 is supplied to the probe 16 via the optical fiber 15. The probe 16 is provided inside the wafer container 13, and emits (applies) the light to the etching liquid moving toward the storage portion 13*a* after being discharged from the wafer 1. Specifically, the light is emitted to the etching liquid flowing along the side surface K2 toward the storage portion 13*a*. As a result, the light is transmitted through the etching liquid, is reflected by the wall constituting the side surface K2, and is received by the probe 16. That is, the light reflected by the wall is incident on the probe 16. The probe 16 supplies the received light to the detector 17 via the optical fiber 15. However, the probe 16 may be provided with a light emitting unit (light application unit) that emits light to the etching liquid and a light receiving unit (light incident unit) that receives light reflected by the wall in such a manner that the light emitting unit and the light receiving unit are separated from each other.

The detector 17 detects the end point of the etching by using the etching liquid moving toward the storage portion 13*a* after being discharged from the wafer 1. Specifically, the detector 17 detects the end point of the etching by detecting the light emitted from the probe 16 to the etching liquid, received by the probe 16, and supplied to the detector 17 from the probe 16. Further, the detector 17 outputs a signal concerning the end point of etching to the controller 18.

An object to be etched in the present embodiment is assumed to be a silicon oxide film. When etching of the silicon oxide film has reached the end point, a certain change can be found in the etching liquid. For example, in a case where the etching liquid is not caused to circulate through the flow passage C, there can be a change found in that the etching liquid having not reached the end point contains silicon or oxygen derived from the silicon oxide film, whereas the etching liquid having reached the end point does not contain silicon or oxygen derived from the silicon oxide film. On the other hand, in a case where the etching liquid is caused to circulate through the flow passage C, there can be a change found in that the silicon concentration or the oxygen concentration of the etching liquid having not reached the end point is increasing, whereas the silicon concentration or the oxygen concentration of the etching liquid having reached the end point is fixed. In addition, a certain change may be found also in an acidic component or an alkaline component in the etching liquid.

As described above, when the etching has reached the end point, a certain change can be found in the composition of the etching liquid. By detection of such a change in the composition by an optical technique or a chemical technique, the end point of etching can be detected.

Therefore, the detector 17 of the present embodiment detects the end point of etching by using (analyzing) the light supplied from the probe 16 to the detector 17. Analysis of light for detection of the end point of etching may be performed by any technique. The analysis result of the light is reflected in the signal to be outputted from the detector 17 to the controller 18. The signal may indicate whether or not the end point of etching has been detected, or may indicate a command issued for the controller 18 and varying according to the detection result of the end point, for example.

The detector 17 may detect the end point of etching by a chemical technique rather than the above optical technique. For example, the detector 17 may detect the end point of etching by using (analyzing) the pH of the etching liquid. Alternatively, the end point of etching may be detected by measurement of the temperature, the concentration, the density, the viscosity, the absorbance, the conductivity, or the oxidation-reduction potential of the etching liquid.

The controller 18 controls various operations of the substrate treatment apparatus. Examples of the controller 18 include a processor, an electric circuit, and a PC (personal computer). For example, the controller 18 controls the rotation of the stage 11, the on/off of the etching liquid nozzle 12, the on/off of the light source 14, the operation of the detector 17, and the on/off of the rinsing liquid nozzle 19.

The controller 18 of the present embodiment controls the etching in accordance with the signal from the detector 17. For example, when the signal indicates that the end point of etching has not been detected, the controller 18 continues ejection of the etching liquid from the etching liquid nozzle 12 to the wafer 1. On the other hand, when the signal indicates that the end point of etching has been detected, the controller 18 stops ejection of the etching liquid from the etching liquid nozzle 12 to the wafer 1.

The rinsing liquid nozzle 19 ejects a rinsing liquid to the wafer 1 on the stage 11 and rinses the wafer 1 with the rinsing liquid, as indicated by reference character P3. The rinsing liquid of the present embodiment is supplied to the upper surface S1 of the wafer 1 being rotated by the stage 11. Therefore, the rinsing liquid supplied to the wafer 1 is discharged from the wafer 1 while being scattered from the wafer 1 by a centrifugal force. This is the same as ejection of the etching liquid.

The controller 18 of the present embodiment controls the etching and rising in accordance with the signal from the detector 17. For example, when the signal indicates that the end point of etching has been detected, the controller 18 stops ejection of the etching liquid from the etching liquid nozzle 12 to the wafer 1, and starts ejection of the rinsing liquid from the rinsing liquid nozzle 19 to the wafer 1. Such control can be implemented by closing of a valve for the etching liquid nozzle 12 and opening of a valve for the rinsing liquid nozzle 19, for example.

The detector 17 may indicate, as the above signal, a command issued for the controller 18 and varying according to the detection result of the end point. For example, when the end point has not been detected, the detector 17 may output a command to continue ejection of the etching liquid. On the other hand, when the end point has been detected, the detector 17 may output a command to stop ejection of the etching liquid and to stat ejection of the rinsing liquid.

As described above, the detector 17 of the present embodiment detects the end point of etching by using the etching liquid moving toward the storage portion 13*a* after being discharged from the wafer 1. Consequently, merits described below can be given.

For example, in a case where the etching liquid stored in the storage portion 13*a* is used to detect the end point, detection of the end point is delayed. The reason for this is that the etching liquid ejected after the end point is reached is mixed with the etching liquid discharged before the end point is reached so that a change in the composition of the etching liquid is moderated. Mixing of the etching liquids involves deterioration in the accuracy of detection of the end point. Further, the storage portion 13*a* is distant from the wafer 1. This involves a delay in detection of the end point. Delayed detection of the end point causes overetching.

In contrast, in the present embodiment, the etching liquid before being stored in the storage portion 13*a* is used to detect the end point. Therefore, when the etching has reached the end point, a change in the composition of the etching liquid becomes steep. Consequently, the end point of etching can be quickly and accurately detected. In addition, since the etching liquid located as close as possible to the wafer 1 is used, a time lag from a time point when the end point is reached to a time point when the end point is detected can be further shortened. According to the present embodiment, the end point can be detected within about one second, for example, after the end point is reached. In other words, according to the present embodiment, detection of the end point and in-situ wet etching control can be performed.

Here, not the etching liquid discharged from the wafer 1 but the etching liquid on the wafer 1 may be considered to be used to detect the end point. However, in this case, there is a possibility that a pattern on the wafer 1 becomes a noise in optical measurement. Furthermore, in order to allow observation of the etching liquid on the wafer 1, oscillation of the wafer 1 may be needed or stop of the rotation of the wafer 1 may be needed. This is not preferable because a delay in etching or a change in the characteristics of etching may be caused. Therefore, in the present embodiment, the etching liquid discharged from the wafer 1 is used to detect the end point.

The end point detection of the present embodiment is suitable in manufacturing of a three-dimensional memory, for example. The reason for this is that, in manufacturing of a three-dimensional memory, a structure having a high aspect ratio is commonly used, and the surface of a film to be etched with an etching liquid is commonly large. When the surface area of a film to be etched is large, an elusion amount of the film eluted into an etching liquid is large so that a change in the composition of the etching liquid becomes more noticeable.

Figure 2:
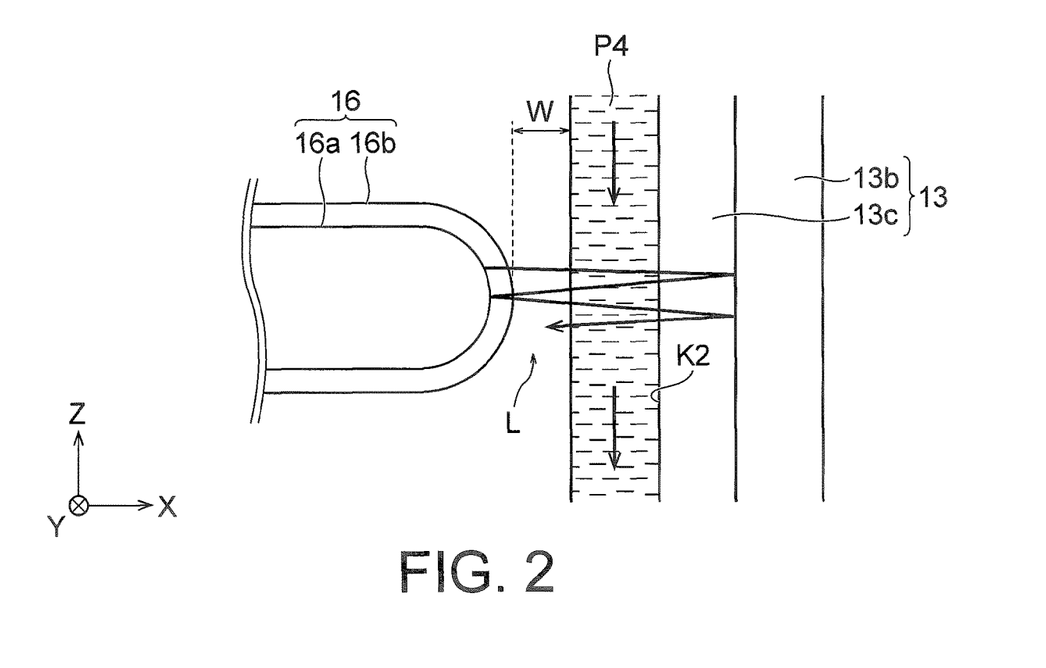
FIG. 2 is a cross-sectional view for explaining end point detection of the first embodiment.

FIG. 2 is a cross-sectional view for explaining the end point detection of the first embodiment.

FIG. 2 illustrates the side surface K2 of the wall of the wafer container 13, and the probe 16 disposed near the side surface K2. Reference character P4 indicates the etching liquid (dynamic flow) falling down, like the stream of a waterfall, along the side surface K2 after colliding with the side surface K2.

The wall constituting the side surface K2 of the wafer container 13 includes a non-transparent member 13b formed of metal, etc., and a transparent member 13c formed of Teflon®, etc. The transparent member 13c is provided on an inner wall surface of the non-transparent member 13b, and has the side surface K2. When the transparent member 13c is formed of Teflon®, a surface of the transparent member 13c is hydrophobic. For this reason, in the present embodiment, the surface of the transparent member 13c is desirably subjected to hydrophilization processing. Accordingly, the side surface K2 becomes hydrophilic, and the etching liquid easily flows along the side surface K2.

The probe 16 includes a lens 16a, and a transparent member 16b provided on a surface of the lens 16a. The transparent member 16b is formed of Teflon®, for example. Reference character L indicates light emitted to the etching liquid flowing along the side surface K2 from the probe 16. The light is transmitted through the etching liquid and the transparent member 13c, is reflected by the non-transparent member 13b, and is received by the probe 16. The light may be reflected by the etching liquid or the transparent member 13c, or may be reflected repeatedly by the probe 16 and the wall of the wafer container 13.

In the present embodiment, the end point of etching is detected by optical measurement using molecular ellipsometry, for example. Accordingly, elusion of an object to be etched can be optically measured as a change in the concentration.

Reference character W indicates a distance between the probe 16 and the etching liquid flowing along the side surface K2. In the present embodiment, the distance W is preferably set within 100 μm. Accordingly, the optical measurement of the present embodiment can be accurately performed.

Figure 3:
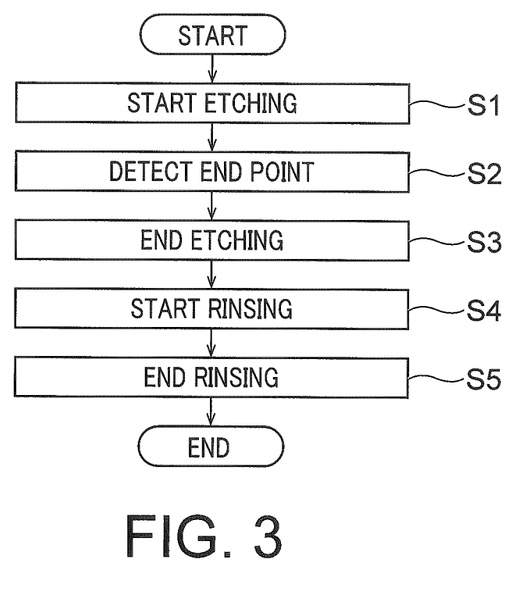
FIG. 3 is a flowchart showing operation of the substrate treatment apparatus of the first embodiment.

FIG. 3 is a flowchart showing operation of the substrate treatment apparatus of the first embodiment.

First, the controller 18 controls the etching liquid nozzle 12 to start etching (step S1). Accordingly, supply of the etching liquid to the wafer 1 is started. The detector 17 starts an etching end point detection process.

When detecting the end point of etching, the detector 17 outputs the signal indicating that the end point of etching has been detected to the controller 18 (step S2). As a result, the controller 18 controls the etching liquid nozzle 12 to stop the etching (step S3), and controls the rinsing liquid nozzle 19 to start rinsing (step S4). Accordingly, supply of the etching liquid to the wafer 1 is stopped, and supply of the rinsing liquid to the wafer 1 is started.

Thereafter, the controller 18 controls the rinsing liquid nozzle 19 to stop rinsing (step S5). Accordingly, supply of the rinsing liquid to the wafer 1 is stopped.

Figure 4A:
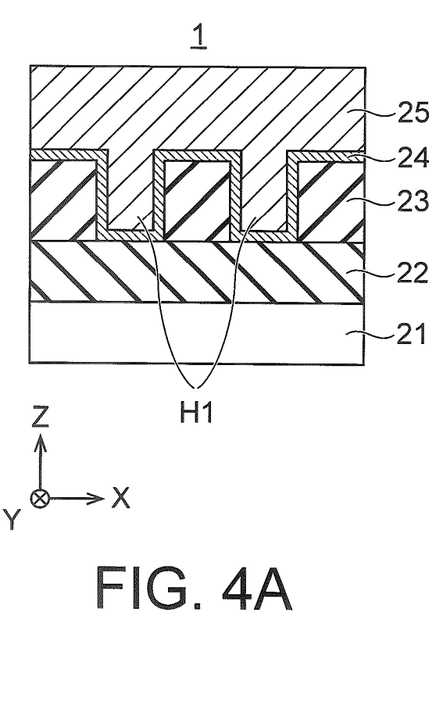
FIGS. 4A to 4C are cross-sectional views showing an example of a method of manufacturing the semiconductor device of the first embodiment.
Figure 4B:
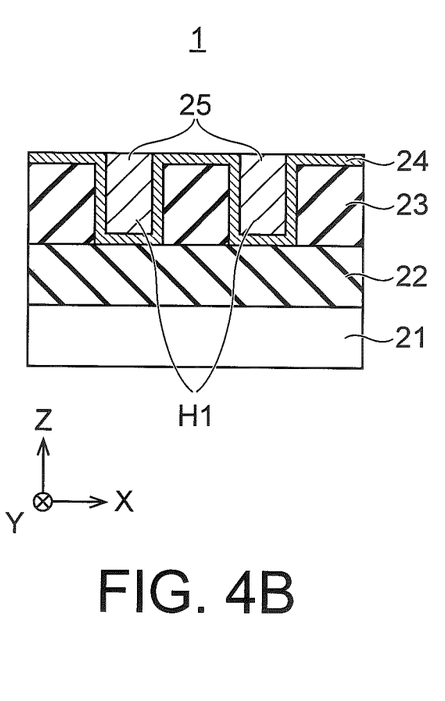
Figure 4C:
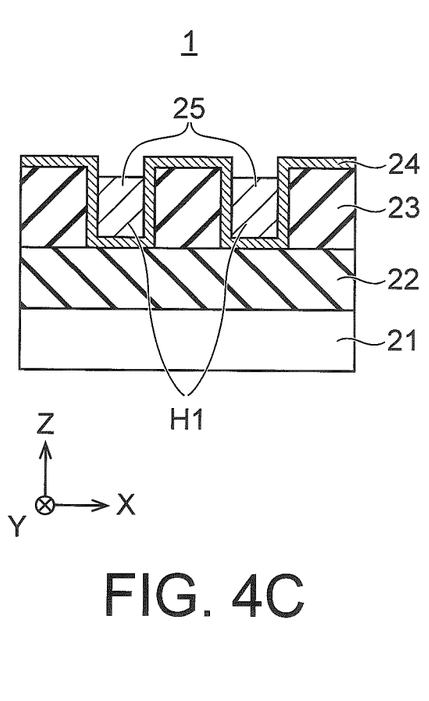

FIGS. 4A to 4C are cross-sectional views showing a method of manufacturing the semiconductor device of the first embodiment.

FIG. 4A shows the wafer 1 of the present embodiment. First, a base layer 22 and an insulating film 23 are formed in order on a substrate (semiconductor wafer). Next, a plurality of openings H1 are formed in the insulating film 23. Next, a barrier metal layer 24 and an interconnection material layer 25 are formed in order on the entire surface of the substrate 21. As a result, the interconnection material layer 25 is formed in the openings H1 and on areas outside the openings H1 via the barrier metal layer 24 (FIG. 4A).

Next, the interconnection material layer 25 is partially removed by wet etching (FIGS. 4B and 4C). FIG. 4B shows a state where the interconnection material layer 25 has been removed until the barrier metal layer 24 is exposed. FIG. 4C shows a state where the interconnection material layer 25 has been further removed from the state in FIG. 4B. According to this example, an interconnection, a contact plug, or a via plug including the barrier metal layer 24 and the interconnection material layer 25, is formed in the openings H1. In this way, the semiconductor device of the present embodiment is manufactured.

Figure 5A:
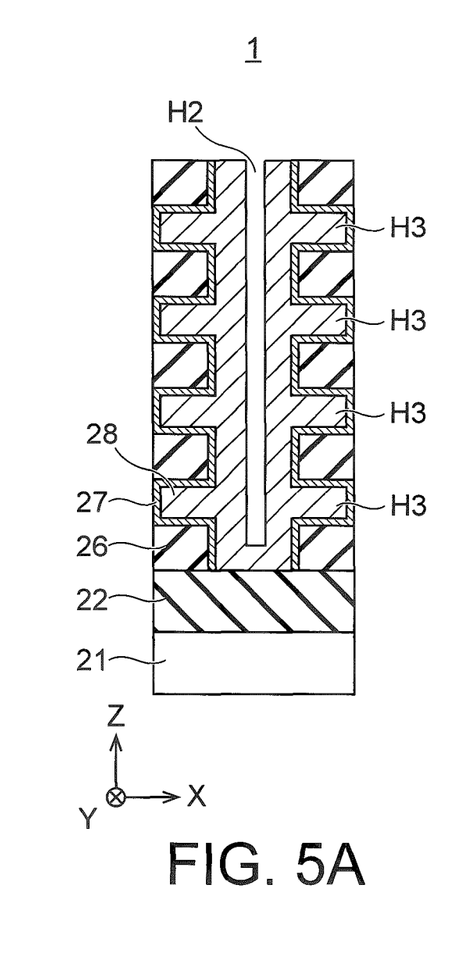
FIGS. 5A to 5C are cross-sectional views showing another example of the method of manufacturing the semiconductor device of the first embodiment.
Figure 5B:
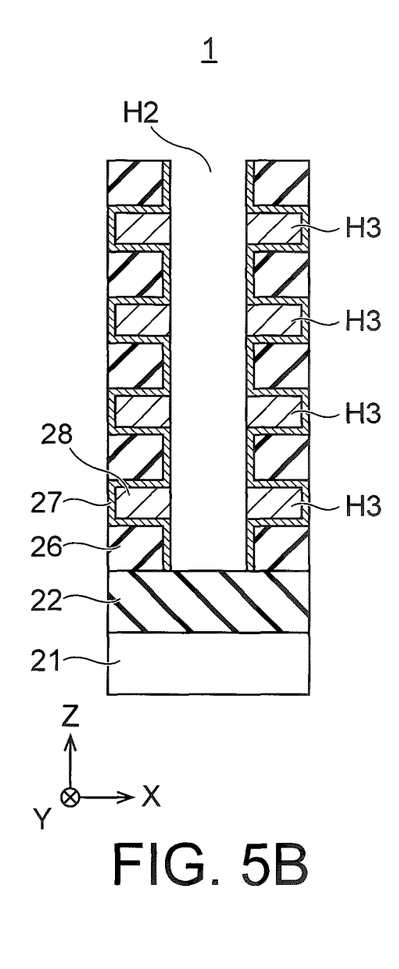
Figure 5C:
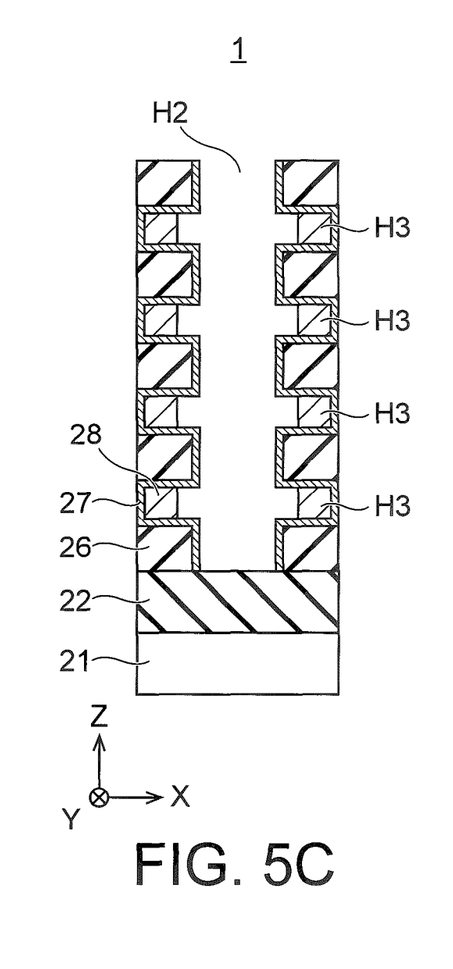

FIGS. 5A to 5C are cross-sectional views showing another example of the method of manufacturing the semiconductor device of the first embodiment.

FIG. 5A shows the wafer 1 of the present embodiment. First, a base layer 22 is formed on a substrate (semiconductor wafer) 21, and a plurality of insulating films 26 and a plurality of sacrificial films are alternately formed on the base layer 22. Next, an opening H2 penetrating the insulating films 26 and the sacrificial films is formed. The sacrificial films are removed by use of the opening H2. As a result, a plurality of openings H3 are formed between the insulating films 26. Next, a barrier metal layer 27 and an interconnection material layer 28 are formed in order on the entire surface of the substrate 21. As a result, the interconnection material layer 28 is formed in the openings H2 and H3 via the barrier metal layer 27 (FIG. 5A).

Next, the interconnection material layer 28 is partially removed by wet etching (FIGS. 5B and 5C). FIG. 5B shows a state where the interconnection material layer 28 has been removed until the barrier metal layer 27 in the opening H3 is exposed. FIG. 5C shows a state where the interconnection material layer 28 has been further removed from the state in FIG. 5B. According to this example, a plurality of interconnections including the barrier metal layer 27 and the interconnection material layer 28 are formed in the plurality of openings H3. The interconnections are word lines of a three-dimensional memory, for example. In this way, the semiconductor device of the present embodiment is manufactured.

Figure 6:
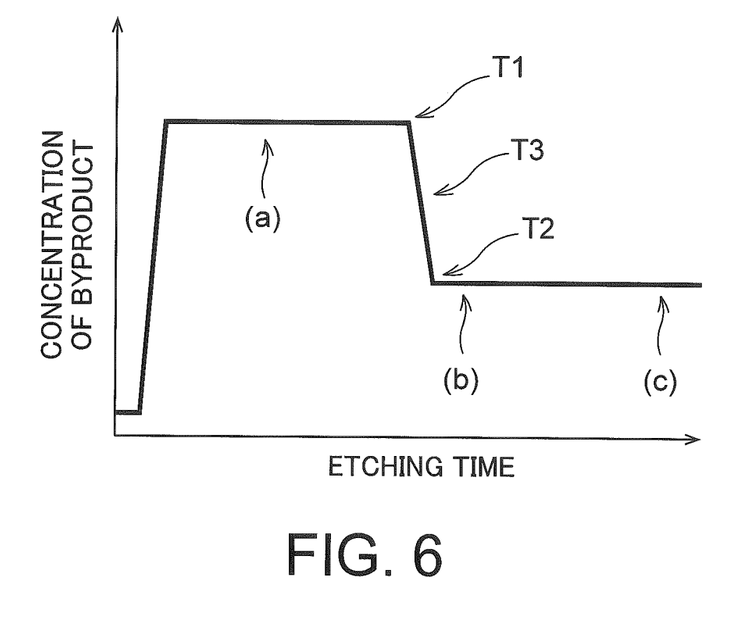
FIG. 6 is a graph for explaining the method of manufacturing the semiconductor device of the first embodiment.

FIG. 6 is a graph for explaining the method of manufacturing the semiconductor device of the first embodiment.

FIG. 6 shows the change in the concentration of a byproduct that is generated in removal (etching) of the interconnection material layer 25 in the steps in FIGS. 4A to 4C, and is included in the etching liquid discharged from the substrate 21. The horizontal axis in FIG. 6 indicates an etching time, and the vertical axis in FIG. 6 indicates the concentration of the byproduct. FIG. 6 shows the concentration of the byproduct in the etching liquid near the area shown in FIG. 2.

An arrow (a), an arrow (b), and an arrow (c) shown in FIG. 6 indicate the concentration of the byproduct in the states in FIGS. 4A, 4B and 4C, respectively. The concentration of the byproduct can be found to be high in the state in FIG. 4A, whereas the concentration of the byproduct can be found to be low in each of the states in FIGS. 4B and 4C. A change such as that shown in FIG. 6 can be found also in a measurement value (e.g., pH) of the etching liquid other than the concentration thereof.

Reference character T1 indicates a time point when lowering of the concentration starts, and reference character T2 indicates a time point when the lowering of the concentration stops. Reference character T3 indicates a time point between T1 and T2. In this way, lowering of the concentration of the byproduct shown in FIG. 6 starts at the time point T1, and stops at the time point T2, and the concentration is then maintained at a fixed value.

The substrate treatment apparatus of the present embodiment starts the end point detection process at the time point T1, and determines that the end point has been detected at the time point T2, for example. Accordingly, wet etching can be ended at a preferable timing.

A preferred end timing may be the state in FIG. 4B, or may be a state where overetching is generated, as shown in FIG. 4C. Therefore, the substrate treatment apparatus of the present embodiment may start the end point detecting process at the time point T1, and may determine that the end point has been detected at the time point T3, for example. Accordingly, control to achieve the state in FIG. 4B, or control of the amount of overetching in the state in FIG. 4C can be performed so that wet etching can be ended at the preferred timing.

The explanation having been described above is similarly applicable to the steps in FIGS. 5A to 5C. In this case, the arrow (a), the arrow (b), and the arrow (c) indicate the concentration of the byproduct in the states in FIG. 5A, FIG. 5B, and FIG. 5C, respectively.

As described above, in the present embodiment, the end point of etching is detected by use of the etching liquid moving toward the storage portion 13a after being discharged from the wafer 1. Therefore, according to the present embodiment, the end point of etching can be accurately detected. Accordingly, overetching and insufficient etching can be suppressed. Furthermore, the etching time can be appropriately controlled according to the etching rate on the workpiece film or the type of the base layer 22.

The technique of the present embodiment may be applied to treatment liquids other than etching liquids. According to the present embodiment, similar to a change in the etching liquid, a change in a treatment liquid can be accurately detected.

While certain embodiments have been described, these embodiments have been presented by way of example only, and are not intended to limit the scope of the inventions. Indeed, the novel apparatuses and methods described herein may be embodied in a variety of other forms; furthermore, various omissions, substitutions and changes in the form of the apparatuses and methods described herein may be made without departing from the spirit of the inventions. The accompanying claims and their equivalents are intended to cover such forms or modifications as would fall within the scope and spirit of the inventions.

The invention claimed is:

1. A substrate treatment apparatus, comprising:
   a supporter configured to support and rotate a substrate;
   a liquid supplier configured to supply a liquid to the substrate;
   a side wall provided separately from the supporter, provided on a lateral side of the substrate, and at least partially surrounding the supporter; and
   a probe provided between the supporter and the side wall and configured to emit light toward the side wall, the light being reflected by the side wall or by the liquid on the side wall,
   wherein the probe includes a first portion facing the supporter and a second portion provided on an opposite side of the first portion and facing the side wall, and the probe is configured to emit the light toward the side wall from the second portion.

2. The apparatus of claim 1, wherein a surface of the side wall is hydrophilic.

3. The apparatus of claim 1, further comprising a detector configured to detect a chemical property of the liquid on the side wall based on the emitted light to the liquid, which is discharged from the substrate.

4. The apparatus of claim 3, wherein the detector detects the light emitted toward the side wall.

5. The apparatus of claim 3, further comprising a controller configured to receive a signal of the liquid on the side wall from the detector.

6. The apparatus of claim 1, wherein the probe includes a lens, and a transparent member provided on a surface of the lens.

7. The apparatus of claim 1, wherein the probe is connected to an optical fiber.

8. The apparatus of claim 1, wherein the probe is provided separately from the side wall.

9. A substrate treatment apparatus, comprising
   a supporter configured to support and rotate a substrate;
   a liquid supplier configured to supply a liquid to the substrate;
   a container configured to house the supporter, the container including a side wall provided on a lateral side of the substrate and a bottom wall provided below the substrate;
   a detector configured to detect a chemical property of the liquid flowing along the side wall after the liquid is discharged from the substrate and before the liquid reaches the bottom wall; and
   a controller configured to control a rotation of the supporter such that the liquid is scattered from the substrate and reaches the side wall.

10. The apparatus of claim 9, wherein the detector is configured to detect light emitted to the liquid on the side wall.

11. The apparatus of claim 10, further comprising a probe provided between the supporter and the side wall and configured to emit the light to the side wall, receive the emitted light, and supply the received light to the detector,
wherein the probe is disposed at a point within 100 μm from the side wall.

12. The apparatus of claim 9, wherein the detector is further configured to detect the chemical property of the liquid by using the liquid flowing along a surface of the side wall toward the bottom wall.

13. The apparatus of claim 12, wherein the detector detects light that is emitted to the liquid flowing along the surface of the side wall toward the bottom wall, transmitted through the liquid and reflected by the side wall.

14. The apparatus of claim 12, wherein the surface of the side wall is hydrophilic.

15. The apparatus of claim 9, further comprising a controller configured to receive a signal of the liquid on the side wall from the detector.

16. The apparatus of claim 9, wherein the bottom wall includes a storage portion configured to store the liquid.

17. The apparatus of claim 16, further comprising a flow passage through which the liquid stored in the storage portion is supplied to the liquid supplier.

* * * * *